United States Patent
Parsons et al.

(10) Patent No.: US 7,102,292 B2
(45) Date of Patent: *Sep. 5, 2006

(54) METHOD AND DEVICE FOR REMOVING HARMONICS IN SEMICONDUCTOR PLASMA PROCESSING SYSTEMS

(75) Inventors: Richard Parsons, Mesa, AZ (US); Wayne L Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 230 days.

This patent is subject to a terminal disclaimer.

(21) Appl. No.: 10/859,603

(22) Filed: Jun. 3, 2004

(65) Prior Publication Data

US 2005/0001555 A1    Jan. 6, 2005

Related U.S. Application Data

(63) Continuation of application No. PCT/US02/37326, filed on Nov. 21, 2002.

(60) Provisional application No. 60/337,171, filed on Dec. 10, 2001.

(51) Int. Cl.
*H01J 7/24* (2006.01)

(52) U.S. Cl. .............................. 315/111.21; 315/111.41; 118/723 I

(58) Field of Classification Search ................ 315/111.01–111.81; 219/121.43, 121.41, 121.52; 118/723 I
See application file for complete search history.

(56) References Cited

U.S. PATENT DOCUMENTS

| | | | | |
|---|---|---|---|---|
| 5,302,882 A | * | 4/1994 | Miller | 315/111.21 |
| 5,325,019 A | | 6/1994 | Miller et al. | 315/111.21 |
| 5,399,999 A | * | 3/1995 | Eisenhart | 333/21 R |
| 5,747,935 A | | 5/1998 | Porter et al. | 315/111.51 |
| 5,900,062 A | * | 5/1999 | Loewenhardt et al. | 118/723 R |
| 6,700,458 B1 | | 3/2004 | Mitrovic et al. | 333/34 |
| 6,812,646 B1 | * | 11/2004 | Windhorn et al. | 315/111.21 |
| 2003/0057844 A1 | | 3/2003 | Windhorn et al. | 315/111.01 |

FOREIGN PATENT DOCUMENTS

| | | |
|---|---|---|
| EP | 1 193 746 A1 | 4/2002 |
| WO | WO 93/05630 | 3/1993 |
| WO | WO 00/68985 | 11/2000 |
| WO | WO 01/61727 | 8/2001 |

OTHER PUBLICATIONS

EPO, "International Search Report from PCT/US02/37326, dated Mar. 10, 2003, which is related to the instant application,".

* cited by examiner

*Primary Examiner*—Wilson Lee
(74) *Attorney, Agent, or Firm*—Pillsbury Winthrop Shaw Pittman LLP

(57) ABSTRACT

A system and method for maintaining a plasma in a plasma region by supplying RF power at a fundamental frequency to the plasma region together with a gas in order to create an RF electromagnetic field which interacts with the gas to create a plasma that contains electromagnetic energy components at frequencies that are harmonics of the fundamental frequency. The components at frequencies that are harmonics of the fundamental frequency are reduced by placing RF energy absorbing resistive loads in energy receiving communication with the plasma, the resistive loads having a frequency dependent attenuation characteristic such that the resistive loads attenuate electrical energy at frequencies higher than the fundamental frequency more strongly than energy at the fundamental frequency.

20 Claims, 5 Drawing Sheets

US 7,102,292 B2

METHOD AND DEVICE FOR REMOVING HARMONICS IN SEMICONDUCTOR PLASMA PROCESSING SYSTEMS

CROSS-REFERENCE TO RELATED APPLICATIONS

This is a continuation of International Application No. PCT/US02/37326, filed on Nov. 21, 2002, which, in turn, relies upon and claims benefit of the filing date of U.S. Provisional Patent Application No. 60/337,171, filed Dec. 10, 2001, the contents of both which are incorporated herein by reference in their entireties.

The present application is related to co-pending applications entitled "Device and Method For Coupling Two Circuit Components Which Have Different Impedances", PCT Application US01/40073, filed Feb. 9, 2001, now U.S. Pat. No. 6,700,458, and "Method and Device for Attenuating Harmonics in Semiconductor Plasma Processing Systems", PCT Application US01/04135, filed Feb. 9, 2001, now U.S. Patent Publication No. US-2003-0057844. Each of these applications is herein incorporated by reference in its entirety.

BACKGROUND OF THE INVENTION

In the past, various techniques have been proposed for selective attenuation of harmonic frequencies created in plasma processing systems. These techniques utilize either a low-pass filter or a trap circuit. For example, U.S. Pat. No. 5,302,882 entitled "LOW-PASS FILTER FOR PLASMA DISCHARGE" discloses such techniques.

In the plasma processing industry, capacitively coupled plasma sources are widely used for dry etching and plasma enhanced chemical deposition. Dry etching is a process for removing a layer of material from a wafer surface. This removal is a result of combined mechanical and chemical effects of high-energy plasma ions striking the substrate surface In plasma enhanced chemical deposition, a layer of a material is deposited on the substrate surface. This material is introduced into the plasma either by sputtering a target made of the material or by supplying a gas which contains the material or from which the material is produced by a chemical reaction. The material may be ionized by the plasma and can then be attracted to the substrate by an electric field.

Plasma processing is commonly used in the semiconductor fabrication industry. The trend in the semiconductor fabrication industry has been toward integrated circuits having smaller elemental features. As a result, etch and deposition rate uniformity over the wafer surface has become more important, particularly when a layer is being etched or deposited according to a pattern. At the same time, recent developments in plasma source technology have led to the increased use of very high frequency RF excitation, e.g., from 60 to 300 MHz, and possibly even higher, to initiate and sustain the plasma.

The use of these very high excitation frequencies provides a benefit in the form of increased power coupling to the plasma, and thus excitation efficiency, that is likely caused by an increase of plasma electron temperature. This increase of RF power coupling affects the plasma density and the harmonic generation in the plasma. However, maintaining high etching and deposition rate uniformity levels at these very high excitation frequencies and with strong harmonics present has proven to be a difficult feat, for a number of reasons.

For example, as the plasma RF excitation frequency is increased, the wavelength of the RF wave decreases. Thus, RF electromagnetic field spatial variations are more pronounced at these higher frequencies and this adversely affects process uniformity. In addition, another trend in the industry is to process larger wafers, 300 mm diameter wafer technology presently being implemented. Of course, as wafer diameter increases, the wavelength-to-wafer-diameter ratio decreases.

Plasma acts as a nonlinear RF circuit element and thus acts as a source of harmonics of the fundamental excitation frequency. These harmonics, due to their higher frequencies, have an even higher power coupling efficiency to the plasma than the fundamental. Therefore, harmonics, even if present at very low power levels, can significantly affect process uniformity due to their very unfavorable wavelength-to-wafer-diameter ratio.

Since harmonics of the RF fundamental excitation frequency have comparatively short wavelengths, they are far more likely to set up resonances in various places in the process chamber, RF transmission lines, cavities, etc., since their half-wavelengths are comparable to the dimensions of these places.

The situation is further worsened by the use of components made of high permittivity ($\epsilon$) and/or permeability ($\mu$) materials, or by the presence of RF transmission structural features that have significant series inductance (L) and/or shunt capacitance (C). Both of these effects reduce the wavelength of the propagating electromagnetic wave in a structure, the former by directly changing the wave propagation velocity, the latter by creating a "slow-wave" structure. This wavelength reduction allows harmonics to resonate in places where they normally would not.

It can thus be seen that reduction of the power content of the harmonics of the RF excitation frequency would improve etch or deposition uniformity.

BRIEF SUMMARY OF THE INVENTION

It is a primary object of the present invention to control the power levels of harmonics of the fundamental frequency of the RF excitation power in plasma processing systems.

The above and other objects are achieved, according to the present invention, by a plasma processing system composed of a chamber enclosing a plasma region, a source of RF power having a fundamental frequency and means for transmitting the RF power from the source into the plasma region for establishing an RF electromagnetic field which interacts with a gas in the plasma region to create a plasma; and energy. Energy controlling members that include RF absorbing loads are disposed in energy-receiving communication with the plasma region. The RF absorbing loads have a frequency dependent attenuation characteristic such that the RF absorbing loads remove electrical energy appearing in the plasma at frequencies higher than the fundamental frequency more strongly than energy at the fundamental frequency.

Objects according to the invention are also achieved by method for maintaining a plasma in a plasma region, which method includes supplying RF power at a fundamental frequency to the plasma region together with a gas in order to create an RF electromagnetic field which interacts with the gas to create a plasma that contains electromagnetic energy components at frequencies that are harmonics of the fundamental frequency, and removing those components from the plasma, wherein the step of removing is carried out by placing RF absorbing loads in energy-receiving communication with the plasma, the loads having a frequency dependent attenuation characteristic such that the loads remove electrical energy appearing in the plasma at frequencies higher than the fundamental frequency more strongly than energy at the fundamental frequency.

DETAILED DESCRIPTION OF THE EMBODIMENTS

Figure 1:
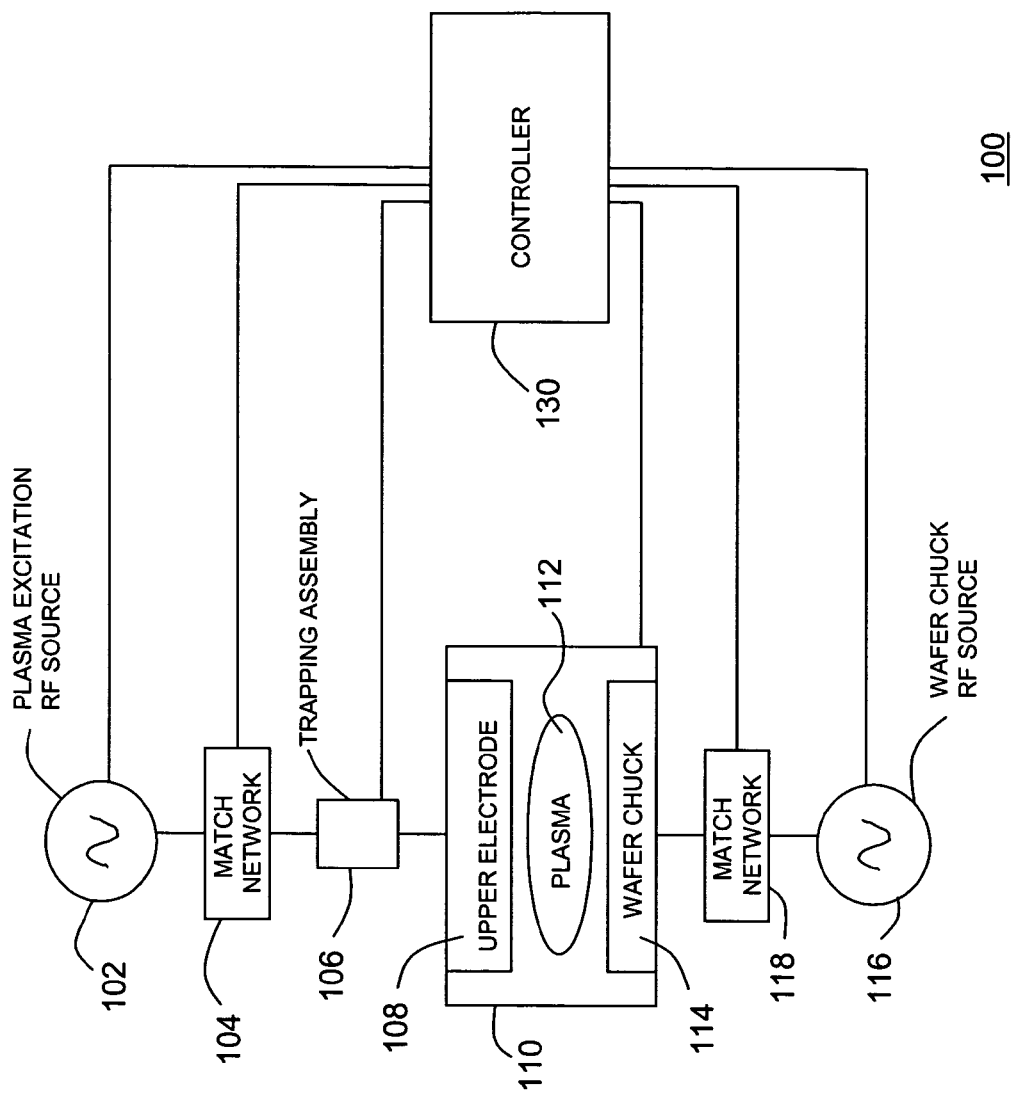
FIG. 1 shows a simplified block diagram of a plasma processing system in accordance with a preferred embodiment of the present invention.

A plasma processing system of the type to which this invention is applied includes a chamber which encloses a plasma region filled with an ionizable gas and into which RF electromagnetic energy is coupled. The energy interacts with the gas to initiate and sustain a plasma. According to the invention, one or more components are provided to control the energy contained in harmonics of the fundamental frequency of the RF energy coupled into and out of the plasma. This harmonic attenuation can take place wherever a suitable impedance-matched coupling structure is present, or can be provided to couple the harmonic power out of the plasma.

In one embodiment, frequency selective trap elements are provided, that selectively absorb power associated with certain harmonics while not affecting the others. Desirably, resistive loads are coupled to the transmission line, which delivers the RF electromagnetic energy to the plasma. All harmonics are generated at impedances different from the impedance of the fundamental frequency, and every harmonic has a different impedance at which it can be attenuated. In order to be effective at trapping different harmonics, the impedance of the trapping assembly must be variable. So not only is the trap frequency selective, but its input impedance is also variable and matched to the impedance of the harmonics that need to be controlled at that frequency. As the input of the matching network is changed, the frequency of the trapping assembly is also changed. As the plasma density or plasma species changes, the impedance of the harmonics will also change. Therefore, the trapping networks and the matching networks have to be tunable.

The design and implementation of a plurality of resistive loads and associated trapping networks that are under automatic control allows precise tailoring of the harmonic content in the plasma. The presence of matching networks is implicitly necessary because of the need to have some physical connection to the electrode so that electrical power can be applied. Thus, a plurality of resistive loads and associated networks are under automatic control so as to allow precise tailoring of the harmonic content of the plasma.

This invention further includes a method of using the trapping network as a plasma harmonic detector to feed back the variations of the harmonics to the controller controlling the trapping network. The plasma harmonic detector detects the spectral content and spatial variations of the RF field in the plasma. The feedback signals from the plasma harmonic detector will adjust the matching networks to minimize a particular function. That particular function can be the spectral and spatial variations of certain harmonics at certain frequency. There is a multiplicity of the small matching networks around the electrode. By using the plasma harmonics detector with a specific algorithm, each of the matching networks can be tuned to achieve the best plasma uniformity results.

This invention still further includes a method of using the apparatus as a process reliability detector by measuring the voltage across the resistive elements in the trap. By monitoring the amount of the power dissipated by the resistive element, a very precise evaluation of the plasma process conditions is made. Measuring the amount of power the plasma available in its harmonic range makes a very subtle and precise measurement of the condition of the plasma.

FIG. 1 shows a simplified block diagram of a plasma processing system in accordance with a preferred embodiment of the present invention. Plasma processing system 100 comprises plasma excitation RF source 102 that supplies RF power at a fundamental frequency and a match network 104. Trapping assembly 106 is coupled between match network 104 and an upper electrode 108, which is located at the top of a plasma chamber 110. Plasma chamber 110 encloses a plasma region in which plasma 112 will be initiated and maintained. A wafer chuck 114 is located at the bottom of the plasma region and is connected to a second RF source 116 via a second match network 118. Electrodes 108, 114 and sources 102, 116 form a capacitively coupled RF plasma source that is used for performing an etch or deposition operation on a wafer mounted on chuck 114. Source 116 acts primarily to impose a DC self-bias on wafer chuck 114, which self-bias acts to attract ions to the surface of the wafer mounted on chuck 114. Trapping assembly 106 is located on the main RF feed line to electrode 108.

Controller 130 is coupled to trapping assembly 106. Controller 130 receives measurement data from trapping assembly 106 and sends control data to trapping assembly 106. Controller 130 processes a portion of the measurement data to create control data. For example, the controller can perform a fast Fourier transform (FFT). In addition, controller 130 is used to control system operations and monitor the process. Controller 130 can comprise a computer or embedded processor, such as a digital signal processor (DSP). These types of processors are known to those skilled in the art.

Plasma 112 can be excited and maintained by RF electromagnetic wave energy at the fundamental RF frequency that is passed to upper electrode 108 and plasma 112 by match network 104 and trapping assembly 106. Trapping assembly 106 comprises a transmission line that is essentially transparent to RF electromagnetic wave energy at that frequency. Plasma 112, in turn, converts some of the energy that it receives at the fundamental frequency into harmonics, and these are coupled back into upper electrode 108 and trapping assembly 106. Energy at harmonic frequencies is strongly attenuated in the resistive loads of trapping assembly 106, and a significant amount of this energy is dissipated in the form of heat along the length of trapping assembly 106. The reduction of power at harmonic frequencies results in better electric field uniformity at and below upper electrode 108, and thus better etch and deposition uniformity.

Figures 2A, 2B:
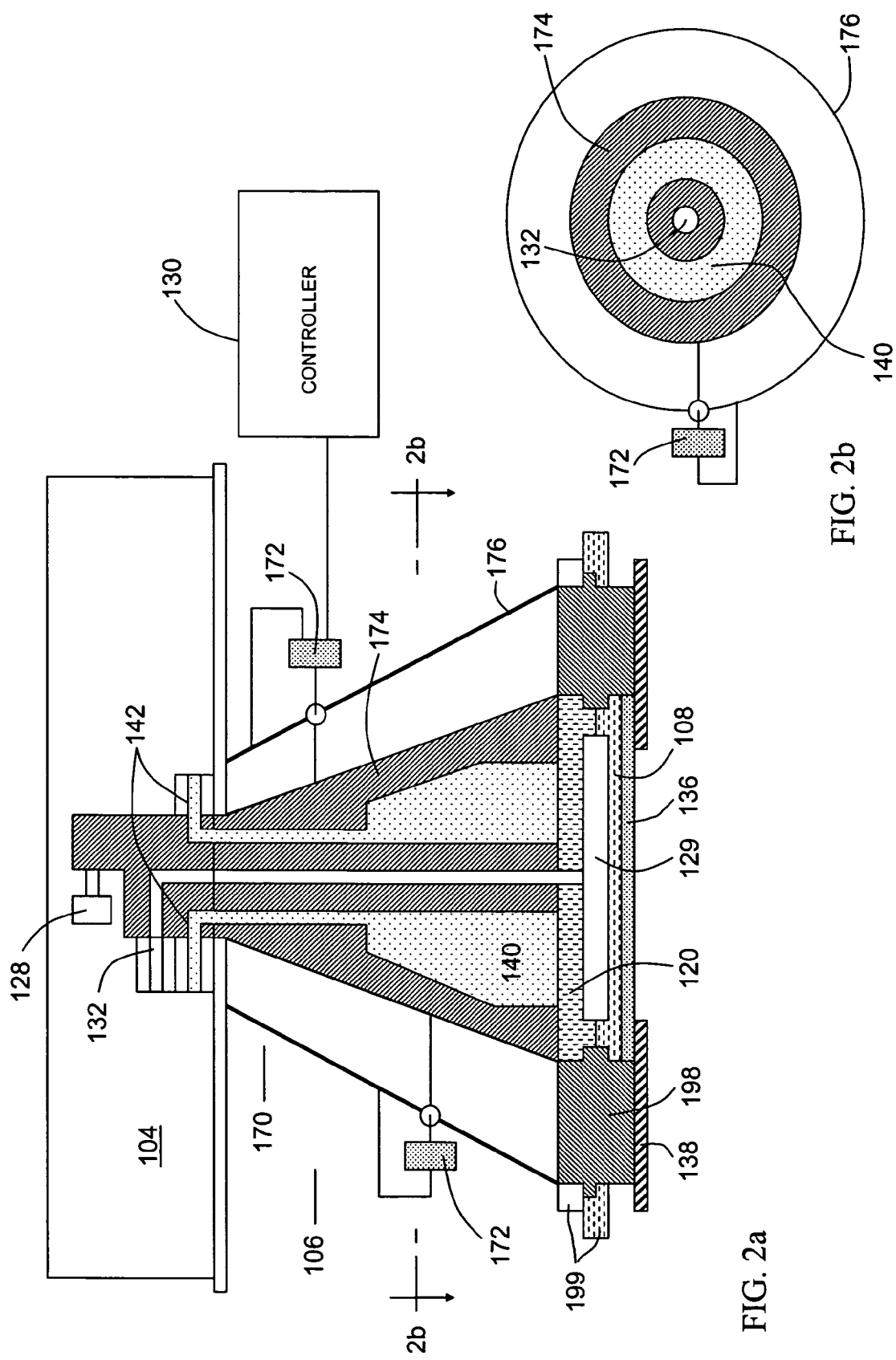
FIG. 2a shows a simplified block diagram of a trapping assembly in accordance with a preferred embodiment of the present invention.
FIG. 2b is a cross-sectional view of a trapping assembly in accordance with a preferred embodiment of the present invention.

FIGS. 2a and 2b show a simplified block diagram of a trapping assembly in accordance with a preferred embodiment of the present invention. Trapping assembly 106 comprises transmission line 170 and a plurality of frequency selective trap elements 172. Transmission line 170 has a frustoconical coaxial geometry. This geometry primarily serves to reduce reflection points between match network 104 and upper electrode 108. Preferably, transmission line 170 has a constant characteristic impedance, which also helps to reduce reflections. By making the ratio of the outer diameter to the inner diameter of transmission line 170 constant, a constant characteristic impedance is maintained. Alternately, the impedance of transmission line 170 can vary along its length.

Transmission line 170 comprises inner conductor 174 and outer conductor 176. Transmission line 170 can comprise any suitable configuration including a coaxial line, microstrip, or strip-line.

Outer conductor 176 comprises a conically shaped sheet of low-loss conducting material such as copper, silver-plated copper, aluminum, or silver-plated aluminum. Outer conductor 176 is coupled to element 199. Element 199 is part of the process chamber wall and supports trapping assembly 106. Outer conductor 176 is coupled to ground via element 199.

Inner conductor 174 comprises a conically shaped block of low-loss conducting material such as copper, silver-plated copper, aluminum, or silver-plated aluminum. Inner conductor 174 is coupled to cooling plate 120, and cooling plate 120 is coupled to electrode 108. Inner conductor 174 comprises at least one cooling channel, as described below.

Frequency selective trap elements 172 are electrically coupled to both inner conductor 174 and outer conductor 176. Frequency selective trap elements 172 on the transmission line are tuned to harmonic frequencies to selectively monitor and control the harmonic content of the plasma. Frequency selective trap elements 172 are arranged in the space outside the outer conductor 176 and are in electrical contact with the inner conductor 174 through an opening in the outer conductor 176. Alternately, frequency selective trap elements 172 can be positioned between the inner conductor 174 and the outer conductor 176.

Conductors 174, 176 and the above-mentioned cooling channel are all axially symmetrical in this embodiment although they do not necessarily need to be. Outer conductor 176 constitutes a RF ground return terminal. The usual two match network output terminals are connected to inner conductor 174 and outer conductor 176, respectively. This is achieved by mounting a match network output capacitor 128 directly on top of the inner conductor 174. Outer conductor 176 is connected within the enclosure of match network 104, which enclosure serves as a ground conductor.

Upper electrode 108 is of the shower head type, provided with a plurality of passages (not shown) for delivery of process gas to the plasma region from a plenum 129 enclosed between electrode 108 and cooling plate 120. The plenum is supplied with process gas by a gas feed line 132. Gas feed line 132 is connected to a process gas source and extends along the vertical axis of the frustoconic outline of transmission line 170.

The lower surface of electrode 108, the surface which faces the plasma region, is covered with a shower-head plate 136, i.e., a plate provided with gas passages aligned with passages. Plate 136 may be made of material compatible with the chamber process, e.g., doped silicon. Plate 136 acts to prevent sputtering of material from electrode 108. In addition, silicon plate 136 is made of a material compatible with the chamber process, to prevent contamination, and as such acts to separate the plasma from the lower surface of electrode 108. This is particularly advantageous when electrode 108 contains a material that is not chemically compatible with the process.

An alumina dielectric ring insulator 198 serves to extend coax transmission line below trapping assembly 106 and around cooling plate 120 and electrode 108. The part of the transmission line constituted by insulator 198 does not absorb any RF and acts as a connection between the plasma and the trapping assembly 106. Insulator 198 constitutes the dielectric of a coax line whose walls are metallic parts provided by cooling plate 120, electrode 108, and the chamber structure, a portion of which is shown as element 199.

A quartz shield ring 138 is attached around plate 136 and below electrode 108. Quartz shield ring 138 is provided to cover the screws that are used to attach silicon plate 136 to electrode 108, thereby isolating those screws from the plasma environment to prevent process contamination. Electrode 108, plate 136 and ring 138 are all attached to, and supported by, cooling plate 120, which is in turn supported by insulator ring 198, the latter itself being supported by the chamber wall structure 199.

Cooling of the inner conductor 174 is performed through a coolant fluid circulated through a cooling channel 140 formed in inner conductor 174. Cooling channel 140 is annular in shape and communicates with a coolant fluid source and a heat exchange element via inlet and outlet cooling lines 142. As noted earlier herein, cooling channel 140 is axially symmetrical. The coolant fluid in channel 140 also acts to cool upper electrode 108.

Match network 104 (details of which are not shown) is mounted on top of trapping assembly 106, and all cooling and gas feed connections are made within its RF enclosure. Match network 104 can be constructed according to principles well known in the art.

Figure 3:
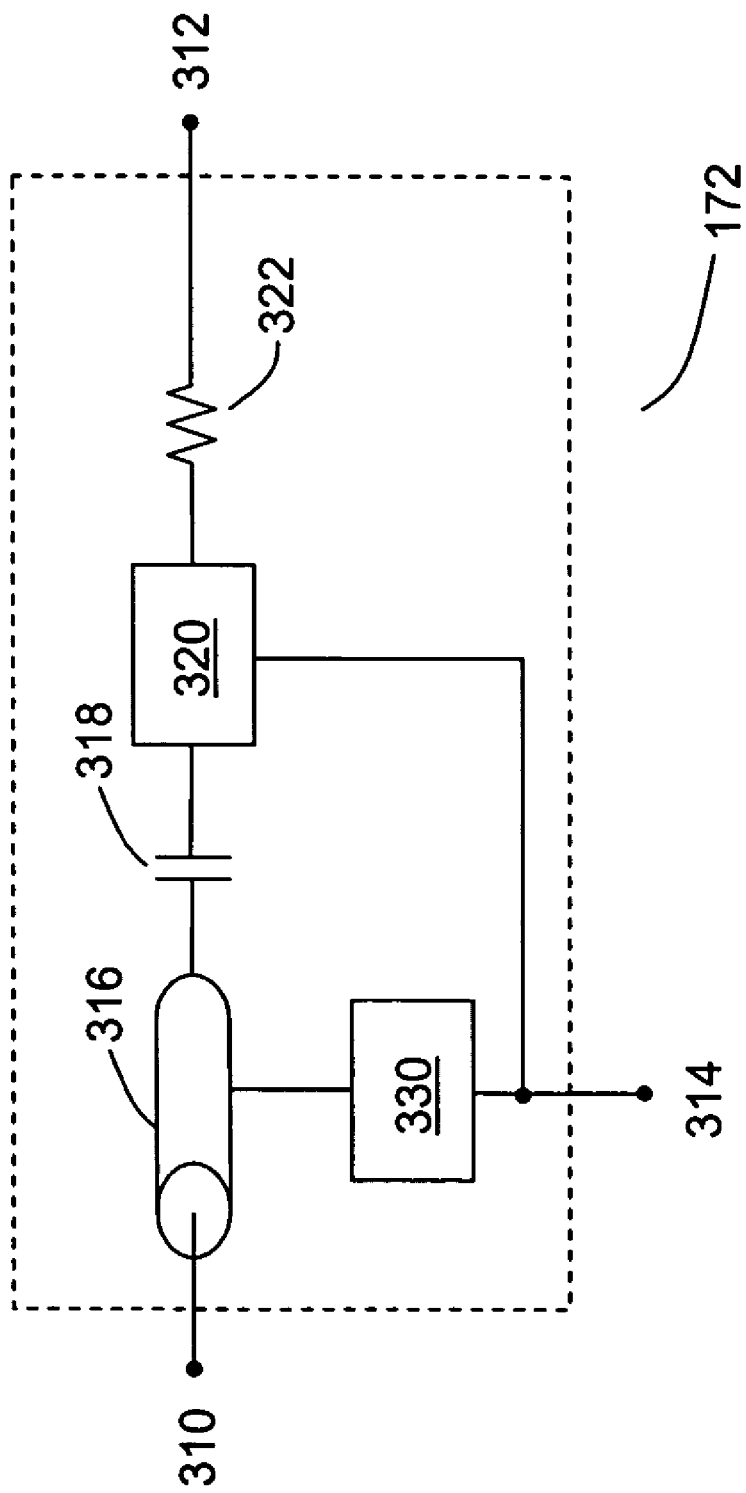
FIG. 3 illustrates a simplified schematic representation of a frequency selective trap element in accordance with a preferred embodiment of the present invention.

FIG. 3 illustrates a simplified schematic representation of a frequency selective trap element in accordance with a preferred embodiment of the present invention. In the illustrated embodiment, frequency selective trap element 172 comprises input port 310 connected to inner conductor 174, output port 312 connected to outer conductor 176, control port 314, transmission line 316, coupling capacitor 318, match network 320, resistive load 322, and probe 330. In the illustrated embodiment, control port 314 is coupled to match network 320 and probe 330. Alternately, other configurations can be envisioned.

Control port 314 is coupled to controller 130 and comprises both control and sensor functions. Control port 314 is configured using at least one shielded cable. Resistive load 322 comprises at least one high power resistor that is mounted on a thermally conductive surface, such as the outer conductor.

Match network 320 comprises a plurality of narrow band components, and wideband components. For example, variable capacitors and variable inductors can be used, or at higher frequencies, stub tuners and hybrid networks can be used. Match network 320 allows each frequency selective trap element 172 to be tuned to a particular harmonic frequency. For example, a control voltage can be provided to at least one varactor diode or at least one variable capacitor.

Matching network techniques are known to those skilled in the art. In addition, match network 320 can provide measurement data from load resistor 322 and/or from match network 320 to controller 130. For example, measurement data can include voltage, current, and/or power data.

Desirably, probe 330 provides measurement data that includes voltage and current information from transmission line 316. Alternately, measurement data can include magnitude and phase information. Controller 130 uses the measurement data to determine which frequency components are present and sends control data to match network 320. Desirably, match network 320 is tuned to the proper frequency, and the desired signal level is achieved at load resistor 322. Alternately, the desired signal level can be achieved at match network 320 or probe 330.

One or more frequency selective trap element 172 is used for each harmonic signal being controlled. Controller 130 is coupled to each one of the frequency selective trap elements 172 and tunes the match networks in all of the frequency selective trap elements 172 in the trapping assembly to achieve the proper harmonic profile. Desirably, proper harmonic profiles can be determined using experimental data from processes providing uniform etch rates. For example, historical data correlating process results to harmonic profiles can be used to produce algorithms for controller 130. Harmonic profiles include fundamental and harmonic signal information.

Also, controller 130 controls the operating levels of the RF sources used to generate the plasma. Controller 130 can adjust these operating levels to control the power delivered to the plasma at the fundamental frequency and to a lesser degree the harmonic levels. For example, controller 130 may have to increase the power delivered to the plasma at the fundamental frequency in order to maintain the desired plasma density. In addition, controller 130 controls the operating frequencies of the RF sources used to generate the plasma and can tune the operating frequencies to further control the harmonic profile. Those skilled in the art will also recognize that controller 130 controls match networks 104 and 108 (FIG. 1) and can use these system level match networks to control the harmonic profile. By controlling the fundamental level and the harmonic levels, controller 130 generates a high density, uniform plasma.

Figure 4:
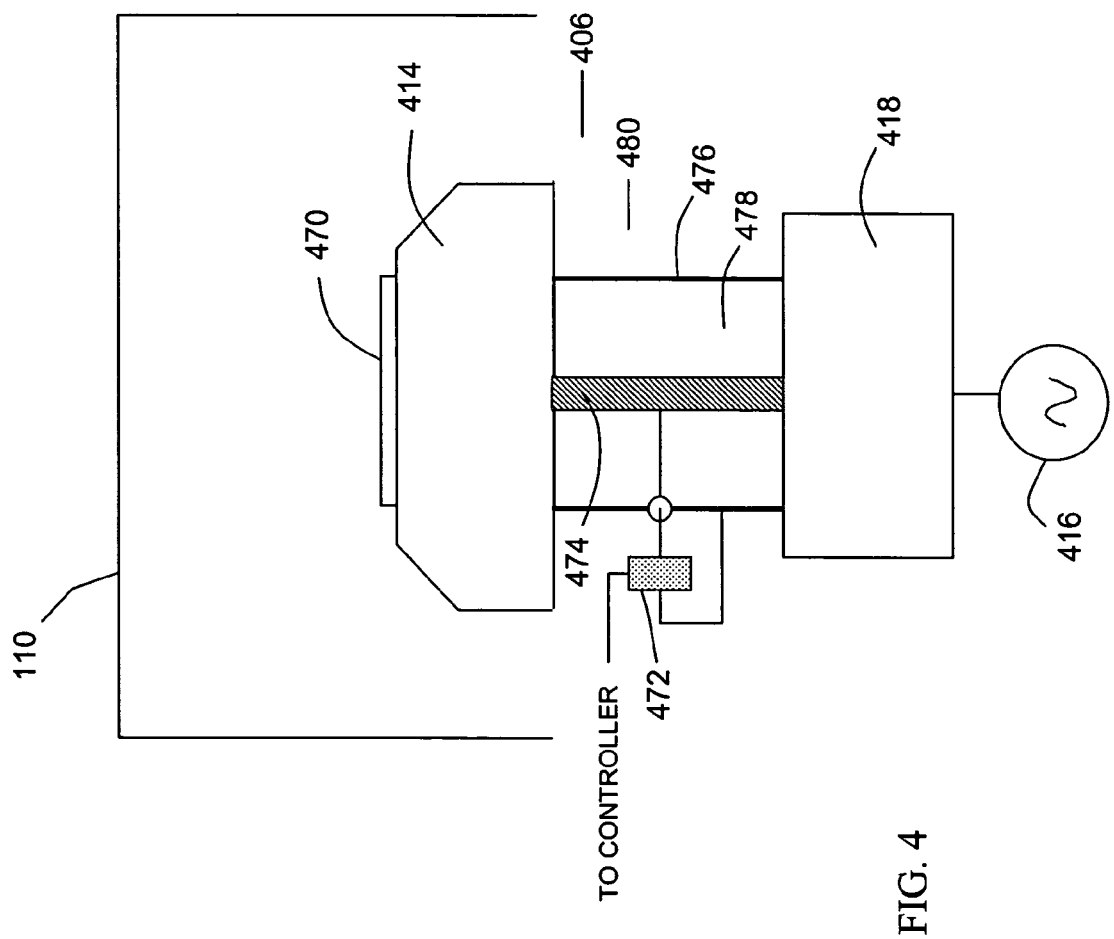
FIG. 4 shows an alternate embodiment of the present invention in which a trapping assembly is coupled between a match network and a lower electrode.

FIG. 4 shows an alternate embodiment of the present invention in which a trapping assembly is coupled between a match network and a lower electrode. Lower electrode comprises a wafer chuck for supporting wafer 470 while a plasma process is performed. RF power is supplied to match network 418 by power source 416.

Trapping assembly 406 comprises transmission line 480 and a plurality of frequency selective trap elements 472. Transmission line 480 is a coaxial transmission line comprising inner conductor 474, outer conductor 476, and dielectric layer 478. At least one frequency selective trap element 472 is coupled between and in electrical contact with conductors 474 and 476.

Frequency selective trap elements 472 selectively controls the amount of energy which arises within the plasma at frequencies that are harmonics of the fundamental frequency produced by power source 416 and also all other frequencies in the chamber associated with upper electrode plasma excitation (e.g., fundamental and harmonics of upper electrode), and which is conducted to trapping assembly 406 via chuck 414, after being coupled into chuck 414 from the plasma.

Figure 5:
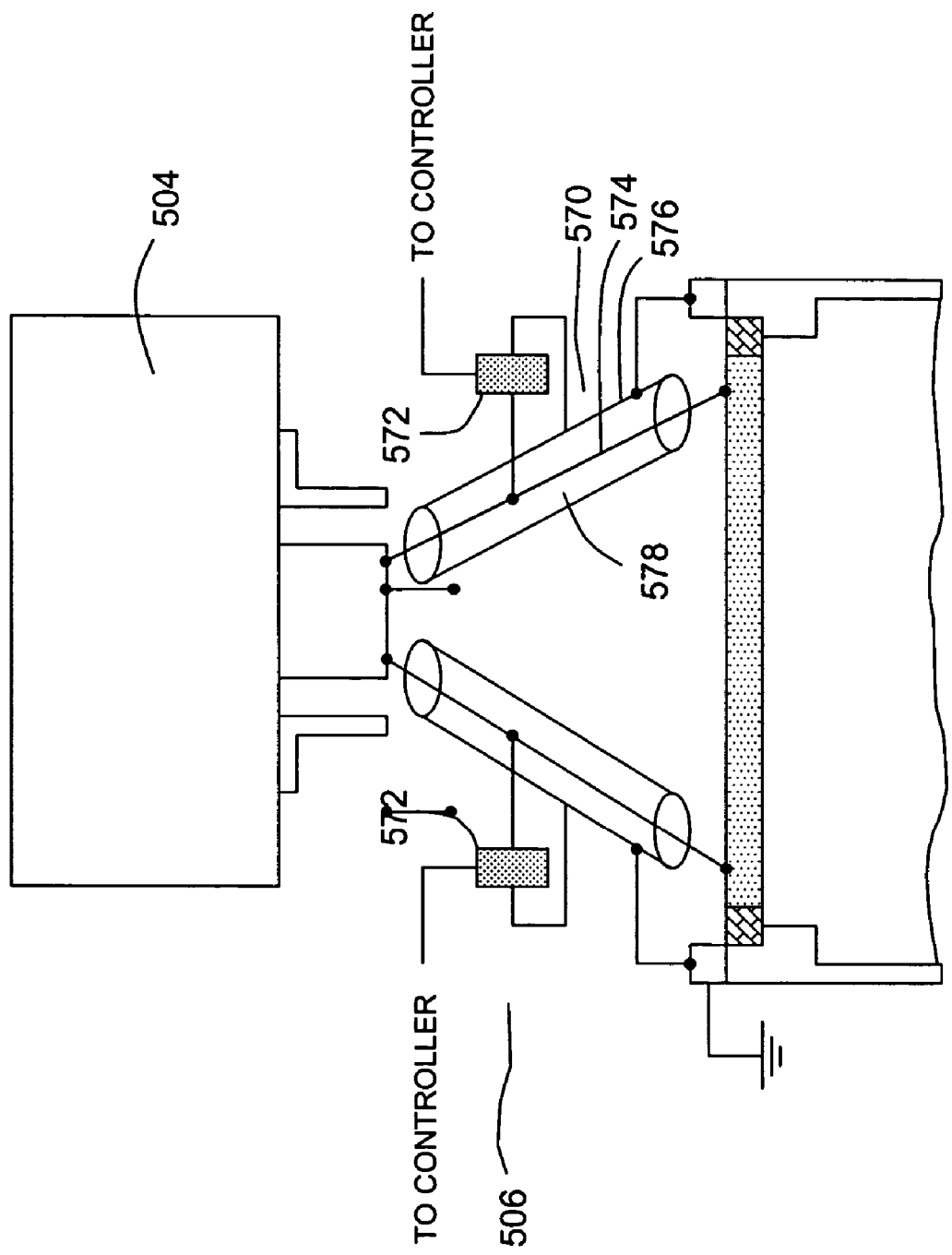
FIG. 5 shows an alternate embodiment of the present invention in which a trapping assembly comprising a plurality of transmission lines is coupled between a match network and an upper electrode.

FIG. 5 shows an alternate embodiment of the present invention in which a trapping assembly comprising a plurality of transmission lines is coupled between a match network and an upper electrode. Trapping assembly 506 comprises a plurality of transmission lines 570 and a plurality of frequency selective trap elements 572. Desirably, at least one frequency selective trap element 572 is coupled to each transmission line 570. Transmission line 570 comprises first conductor 574, second conductor 576, and dielectric 578. Transmission lines 570 can comprise any suitable configuration including coaxial line, microstrip, or strip-line. Transmission lines 570 can have different physical characteristics.

One or more frequency selective trap elements can be tuned to selectively control the amount of energy, which arises within the plasma chamber at frequencies that are harmonics of the fundamental frequency. In addition, when multiple transmission lines are used in a trapping assembly, the transmission lines can be designed to make the trapping assembly more efficient.

Alternately, the transmission lines can also comprise an absorber material, which can be used to further control the harmonic levels.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A plasma processing system comprising:
a chamber enclosing a plasma region;
a system component disposed in said chamber in communication with said plasma region,
a source of RF power having at least one fundamental frequency; and
trapping assembly for transmitting the RF power from said source to said plasma region via said system component, said trapping assembly comprising at least one frequency selective trap element that includes resistive loads disposed in energy-receiving communication with said system component,
wherein said frequency selective trap element has frequency dependent attenuation characteristics such that said frequency selective trap element attenuates electrical energy appearing in the plasma at frequencies higher than the fundamental frequency more strongly than energy at the fundamental frequency.

2. The system of claim 1 wherein said frequency selective trap element forms part of an electrical energy flow path from said system component.

3. The system of claim 2 wherein said plasma processing system further comprising a matching network connected between said source of RF power and said trapping assembly.

4. The system of claim 3 wherein said trapping assembly comprises a transmission line having an annular form.

5. The system of claim 4 wherein said transmission line has a frustoconical form with a large base directed toward said plasma region.

6. The system of claim 4 further comprising a cooling chamber in communication with said trapping assembly for removing heat from said resistive loads.

7. The system of claim 1 wherein said system component includes an upper electrode connected to said trapping assembly and communicating with the plasma region, and wherein a cooling chamber is located to remove heat from said upper electrode.

8. The system of claim 4 wherein said transmission line comprises a coaxial transmission line composed of two conductive members between which said frequency selective trap elements are disposed.

9. The system of claim 1 wherein said system component includes a lower electrode connected to said trapping assembly and communicating with the plasma region.

10. The system of claim 1 wherein said system component comprises an upper electrode, said trapping assembly comprising a plurality of transmission lines coupled to said frequency selective trap elements.

11. The system of claim 1 wherein said system component comprises a lower electrode, said trapping assembly comprising a plurality of transmission lines coupled to said frequency selective trap elements.

12. The system of claim 1 wherein:
said system component comprises a wafer chuck and said means for transmitting the RF power comprise a coaxial transmission line connected to said chuck;
said trapping assembly comprises two conductors; and
said frequency selective trap elements are coupled between said two conductors and at least one resistive load is interposed outside said two conductors.

13. The system of claim 1 wherein:
said system component comprises a wafer chuck and said means for transmitting the RF power comprise a coaxial transmission line connected to said chuck;
said trapping assembly comprises two conductors; and
said frequency selective trap elements are coupled between said two conductors and at least one resistive load is interposed inside said two conductors.

14. The system of claim 1, wherein said frequency selective trap element comprises at least one control network coupled to a resistive load, said control network comprising at least one control element and at least one sensor element.

15. The system of claim 1 wherein said plasma processing system further comprises a controller coupled to at least one frequency selective trap element.

16. A plasma processing system comprising:
a chamber enclosing a plasma region;
a source of RF power having at least one fundamental frequency;
a RF power conductor assembly coupling said source of RF power to said plasma region to deliver the RF power into said plasma region where the RF power forms an RF electromagnetic field which interacts with a gas in said plasma region to create a plasma; and
a RF energy trapping assembly that includes resistive loads disposed in energy-receiving communication with said plasma region,
wherein said resistive loads have frequency dependent attenuation characteristic such that said resistive loads attenuate electrical energy at frequencies higher than a fundamental frequency more strongly than energy at the fundamental frequency.

17. A method for maintaining a plasma in a plasma region, comprising:
supplying RF power having a fundamental frequency to the plasma region together with a gas in order to create an RF electromagnetic field which interacts with the gas to create a plasma that contains electromagnetic energy components at frequencies that are harmonics of the fundamental frequency; and
controlling said components, wherein said controlling is carried out by placing at least one frequency selective trap element in energy receiving communication with the plasma, said frequency selective trap element having a frequency dependent attenuation characteristic such that said frequency selective trap element attenuates electrical energy at a frequency higher than the fundamental frequency more strongly than energy at the fundamental frequency.

18. The method of claim 17, wherein said frequency selective trap element is coupled to a transmission line for supplying the RF power to the plasma.

19. The method of claim 17, further comprising:
measuring a signal from at least one frequency selective trap element; and
changing the RF power.

20. The method of claim 17, further comprising the steps of:
measuring a signal from at least one frequency selective trap element; and
tuning a frequency selective trap element.

* * * * *